(12) United States Patent
Naczas et al.

(10) Patent No.: US 8,999,779 B2
(45) Date of Patent: Apr. 7, 2015

(54) LOCALLY RAISED EPITAXY FOR IMPROVED CONTACT BY LOCAL SILICON CAPPING DURING TRENCH SILICIDE PROCESSINGS

(71) Applicant: International Business Machines Corporation, Armonk, NY (US)

(72) Inventors: Sebastian Naczas, Albany, NY (US); Vamsi Paruchuri, Clifton Park, NY (US); Alexander Reznicek, Troy, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/019,568

(22) Filed: Sep. 6, 2013

(65) Prior Publication Data
US 2015/0069531 A1 Mar. 12, 2015

(51) Int. Cl.
*H01L 21/84* (2006.01)
*H01L 29/78* (2006.01)

(52) U.S. Cl.
CPC .................................... *H01L 29/785* (2013.01)

(58) Field of Classification Search
CPC ............... H01L 21/823431; H01L 21/823821; H01L 27/0886; H01L 27/1211
USPC .......... 438/164, 283, 284, 412; 257/353, 401, 257/410
See application file for complete search history.

(56) References Cited

U.S. PATENT DOCUMENTS

| 7,804,137 | B2 * | 9/2010 | Kang et al. ............... 257/369 |
|---|---|---|---|
| 8,173,551 | B2 | 5/2012 | Bai et al. |
| 8,362,574 | B2 | 1/2013 | Kawasaki et al. |
| 8,367,528 | B2 | 2/2013 | Bauer et al. |
| 2005/0242395 | A1 | 11/2005 | Chen et al. |
| 2011/0316081 | A1 | 12/2011 | Chan et al. |
| 2012/0108016 | A1 | 5/2012 | Kawasaki |
| 2012/0256238 | A1 | 10/2012 | Ning et al. |
| 2012/0280250 | A1 | 11/2012 | Basker et al. |
| 2013/0056795 | A1 | 3/2013 | Wu et al. |
| 2013/0200468 | A1 | 8/2013 | Cai et al. |
| 2013/0228836 | A1 | 9/2013 | Tsai et al. |
| 2014/0203370 | A1 | 7/2014 | Maeda et al. |

OTHER PUBLICATIONS

International Search Report for application No. PCT/CN2014/084756, mailed on Oct. 27, 2014.

* cited by examiner

*Primary Examiner* — Tu-Tu Ho
(74) *Attorney, Agent, or Firm* — Joseph Petrokaitis; L. Jeffrey Kelly

(57) ABSTRACT

A low resistance contact to a finFET source/drain can be achieved by forming a defect free surface on which to form such contact. The fins of a finFET can be exposed to epitaxial growth conditions to increase the bulk of semiconductive material in the source/drain. Facing growth fronts can merge or can form unmerged facets. A dielectric material can fill voids within the source drain region. A trench spaced from the finFET gate can expose the top portion of faceted epitaxial growth on fins within said trench, such top portions separated by a smooth dielectric surface. A silicon layer selectively formed on the top portions exposed within the trench can be converted to a semiconductor-metal layer, connecting such contact with individual fins in the source drain region.

8 Claims, 24 Drawing Sheets

US 8,999,779 B2

LOCALLY RAISED EPITAXY FOR IMPROVED CONTACT BY LOCAL SILICON CAPPING DURING TRENCH SILICIDE PROCESSINGS

BACKGROUND

The present disclosure relates to semiconductor structures, and particularly to fin-type field effect transistor structures and a method of manufacturing the same.

Fully depleted devices such as fin field effect transistors (finFETs) are candidates for scaling of gate lengths to 14 nm and below. A narrow fin structure may be optimal for channel control, but can lead to increased contact resistance in the source/drain. A larger contact area (and hence less contact resistance) can be provided by merging the fins in the source/drain, and contact resistance may be further reduced by converting an upper portion of epitaxial material in the source/drain to a silicide. However, epitaxial growth to merge the fins has proven to be challenging. The interface where epitaxial growth from facing fin sidewalls can be defective and such defects can provide a preferred diffusion path such as for nickel, which can be fatal to the associated device.

A more defect-free surface on which to form a contact can be achieved by stopping the epitaxial growth before facing growth fronts touch, such that the source drain fins become wider but are not merged. However, silicidation of the unmerged source drain introduces new defects. A process to form finFET transistors that avoids such defects would be desirable.

SUMMARY

Accordingly, a first aspect of the invention is a finFET structure that includes a set of fins arrayed on a substrate and a gate formed over at least an adjacent pair of said set of fins, where the adjacent pair of fins extends into a source/drain (S/D) region and epitaxial material is grown on facing sidewalls of said adjacent pair within said S/D region such that first epitaxial material is formed on a first of said facing sidewalls, and second epitaxial material is formed on a second of said facing sidewalls. Both of said first epitaxial material and said second epitaxial material include an upper surface facing away from said substrate, which upper surfaces slope from the associated sidewall toward said substrate. A dielectric material is disposed on the substrate between the facing sidewalls at a depth such that the dielectric material covers a lower portion of both said upper surfaces; and a bar is conductively connected to an upper portion of both said upper surfaces.

Another aspect of the invention is a finFET including a gate and a source/drain (S/D) region formed on a substrate, the gate formed over a set of fins, wherein the gate includes a first spacer and at least three of said fins extend into said S/D region, the finFET further comprising first epitaxial material formed on facing sidewalls of a first adjacent pair of said set within said S/D region, and second epitaxial material formed on facing sidewalls of a second adjacent pair of said fins within said S/D region, and a contact conductively connecting said first epitaxial material to said second epitaxial material, wherein the contact is spaced from said gate spacer by a dielectric region. The dielectric region can constitute an oxide layer or a second spacer or both.

Another aspect of the invention is a method to form a finFET, the method comprising: on an initial structure that includes a gate formed over a set of fins on a substrate and at least two of said set which extend into a S/D region adjacent to said gate, forming epitaxial material on said at least two of said set within said S/D region; covering such epitaxial material with a dielectric layer; forming a cavity in said dielectric material to expose an area of said epitaxial material, wherein said cavity extends generally parallel to said gate and is separated from said gate by a region of said dielectric material; growing a silicon cap on said area; and forming a conductive bar in said cavity whereby a layer of said silicon cap is converted to silicide. Optionally, a spacer can be formed on the gate after forming such doped epitaxial material on the fins and before the step of covering the fins with dielectric. Optionally, the silicon cap can be formed on certain source/drain regions and not on others

BRIEF DESCRIPTION OF SEVERAL VIEWS OF THE DRAWINGS

FIG. 5A is a top-down view and FIG. 5B is a cross-sectional view within the trench along the vertical plane AA of FIG. 5A. FIG. 5C is a cross-sectional view parallel to a fin along the vertical plane CC of FIG. 5A.

FIG. 6A is a top-down view and FIG. 6B is a side view according to an embodiment of the invention.

DETAILED DESCRIPTION

Figure 1A:
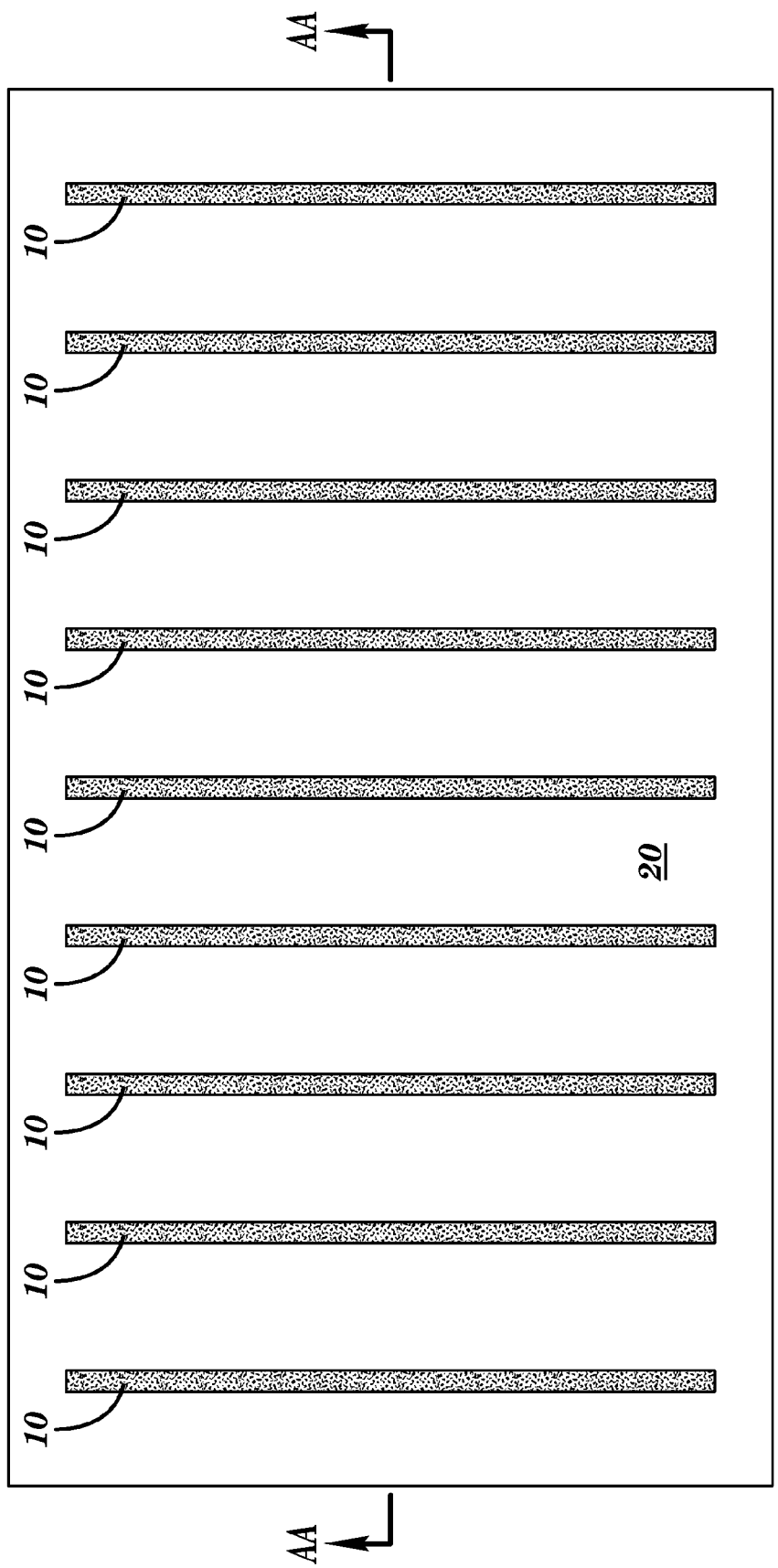
FIGS. 1A, 1B, and 1C illustrate an array of fins formed on a substrate. 1A is a top-down view, and 1B and 1C illustrate a side view of different embodiments.

As stated above, the present disclosure relates to a finFET structure with low source/drain contact resistance and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1B:
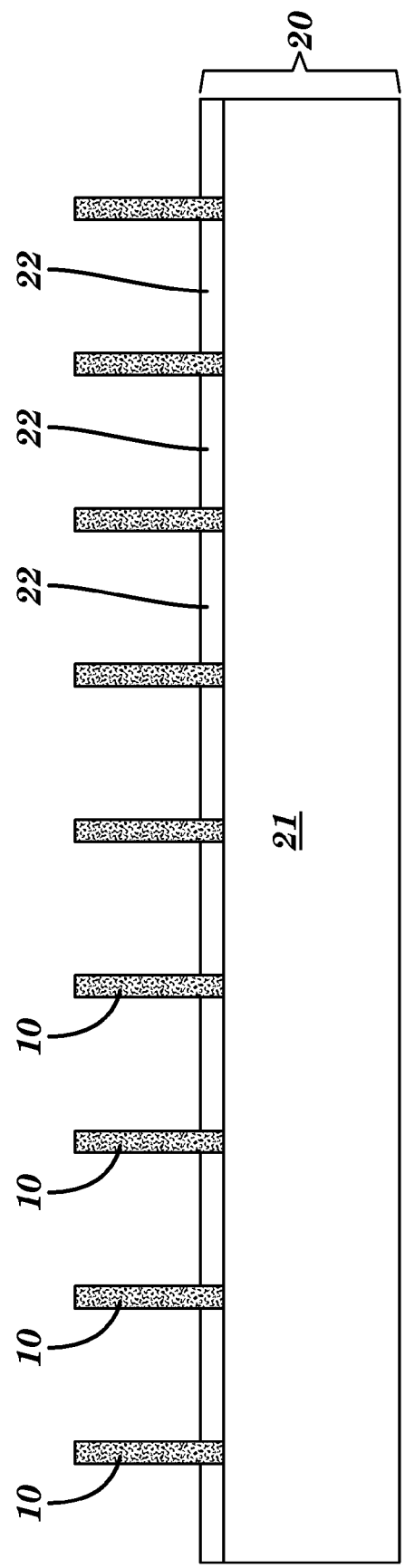
Figure 1C:
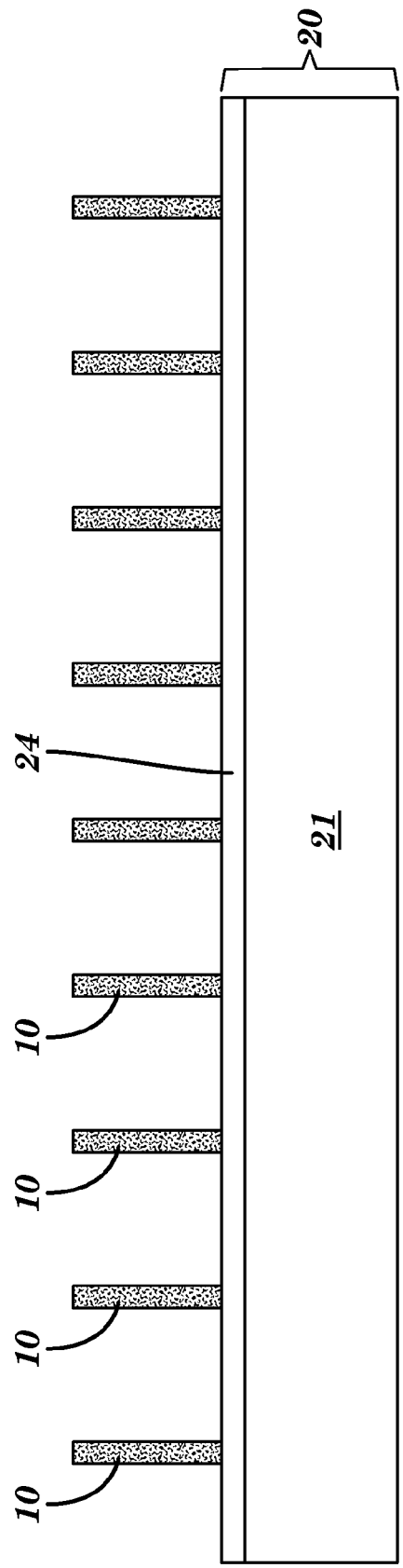

FIGS. 1A-1C illustrate an array of fins (10) formed on a substrate (20) which constitutes a preliminary structure for an embodiment of the present invention. As shown in FIG. 1A, the fins 10 can have uniform width and the fin array can have uniform spacing. In embodiments the width may be in the range of 4 nm to 15 nm, although lesser or greater fin width can be employed. In embodiments the spacing may be in the range of 15 nm to 100 nm, although lesser or greater fin spacing can be employed.

Typically substrate 20 is a whole or a portion of a semiconductor wafer formed of any semiconducting material including, for example, Si, Ge, SiGe, SiC, SiGeC, InAs, GaAs, InP or other like III/V compound semiconductors. Substrate 20 can be the buried insulator and a supportive semiconductor layers of an SOI wafer (semiconductor-on-insulator), ETSOI wafer (extremely thin semiconductor-on-insulator), or SiGeOI wafer. Alternatively, as shown in FIG. 1B, substrate 20 can include regions of non-semiconductor material which could be a dielectric material 22 such as silicon dioxide disposed between fins 10 formed from a so-called 'bulk' wafer (e.g., formed entirely of one or more of the above listed semiconducting materials).

The fins 10 can be a topmost semiconductor layer (i.e., a semiconductor-on-insulator (SOI) layer) of a semiconductor-on-insulator substrate. FIG. 1C illustrates such an embodiment wherein the fins 10 can be present on an uppermost surface of buried insulator layer 24, and layer 24 is mechanically supported by a handle substrate 21. The insulator layer 24 can be thicker or thinner per design objectives, often in the range of 75 nm to 145 nm, although thinner layers can be employed (10-20 nm). The insulator layer 24 maybe a crystalline or non-crystalline oxide or nitride, for example, silicon dioxide.

Typically, at least the fins (10) are formed of single crystalline semiconductor material. The fins can be formed such that their sidewalls have {100} or {110} crystal orientation, The handle substrate 21 can include regions that are single crystalline and other regions that are polycrystalline or amorphous. In embodiments, the fins (10) can be single crystalline silicon or a single crystalline silicon-germanium alloy semiconductor material. In some embodiments, some fins can have different composition or crystal orientation than other fins. The handle substrate 21 can be the same material of the fins but the invention is not so limited. In embodiments, the fins 10 and the substrate 21 are both comprised of silicon.

The substrate 21 or the fins 10 or both can be doped with p-type dopants or n-type dopants, and the dopant concentration can be in a range from $1.0 \times 10^{14}/cm^3$ to $1.0 \times 10^{17}/cm^3$, although lesser and greater dopant concentrations can also be employed. In embodiments, the dopant can be boron or phosphorus. In some embodiments, different portions of the structure can be doped with dopants of different conductivity types.

Figure 2A:
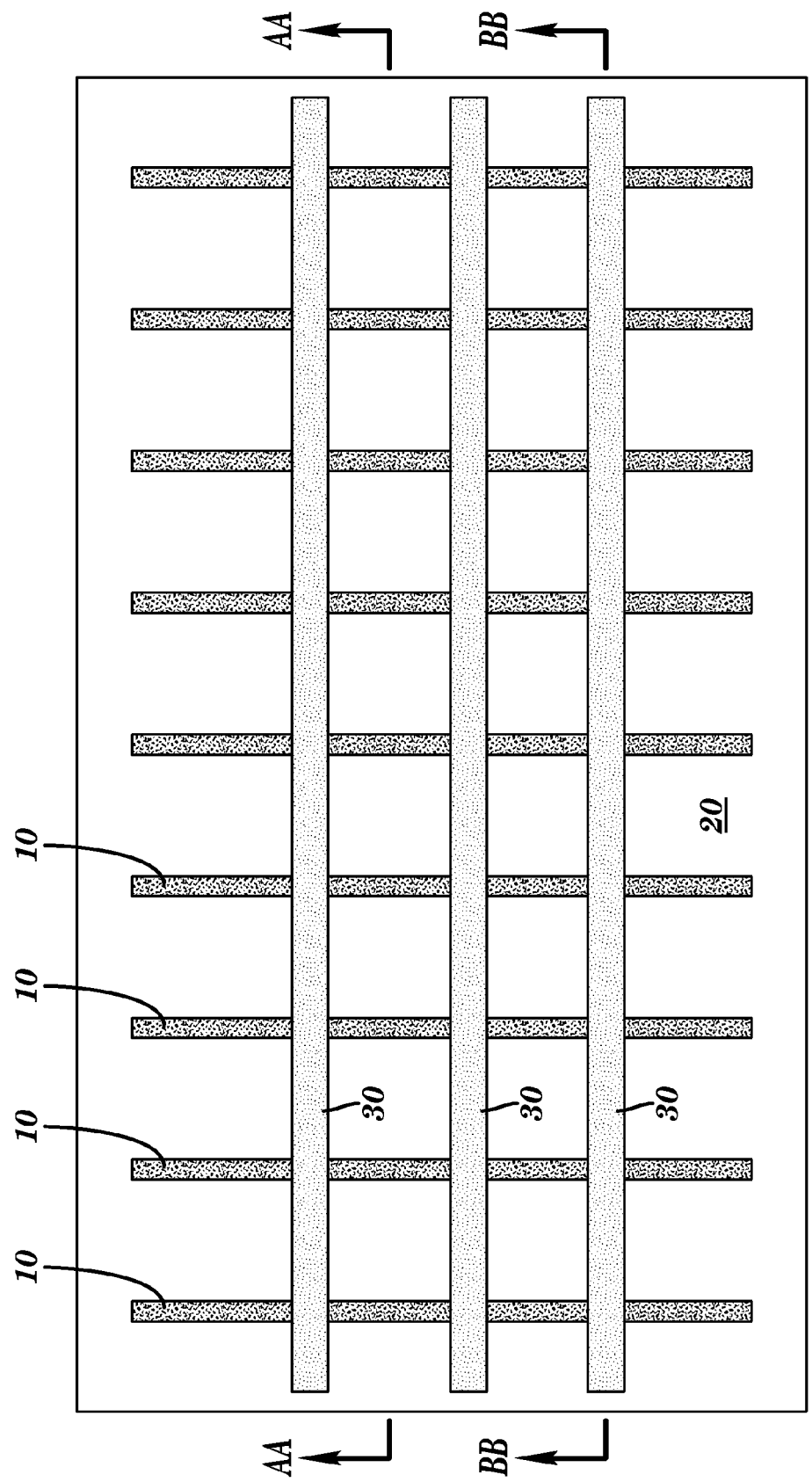
FIGS. 2A, 2B, and 2C are views of a gate array formed across an array of fins. 2A is a top-down view, and 2B is a side view along line BB (within a gate structure), and 2C is a side view along line AA (between gate structures).
Figure 2B:
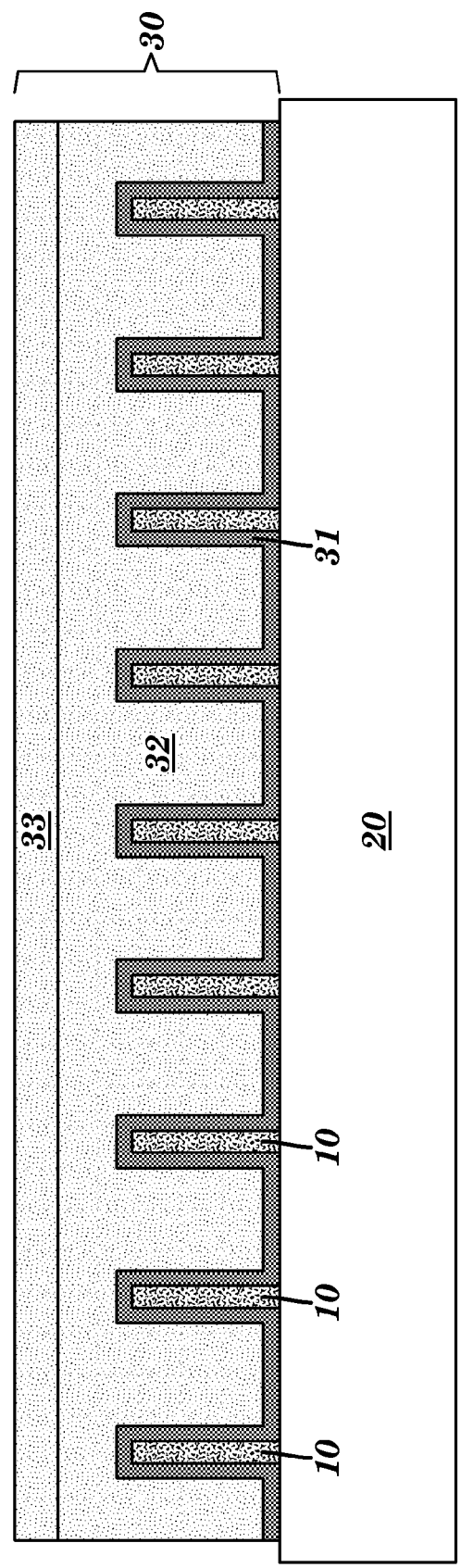
Figure 2C:
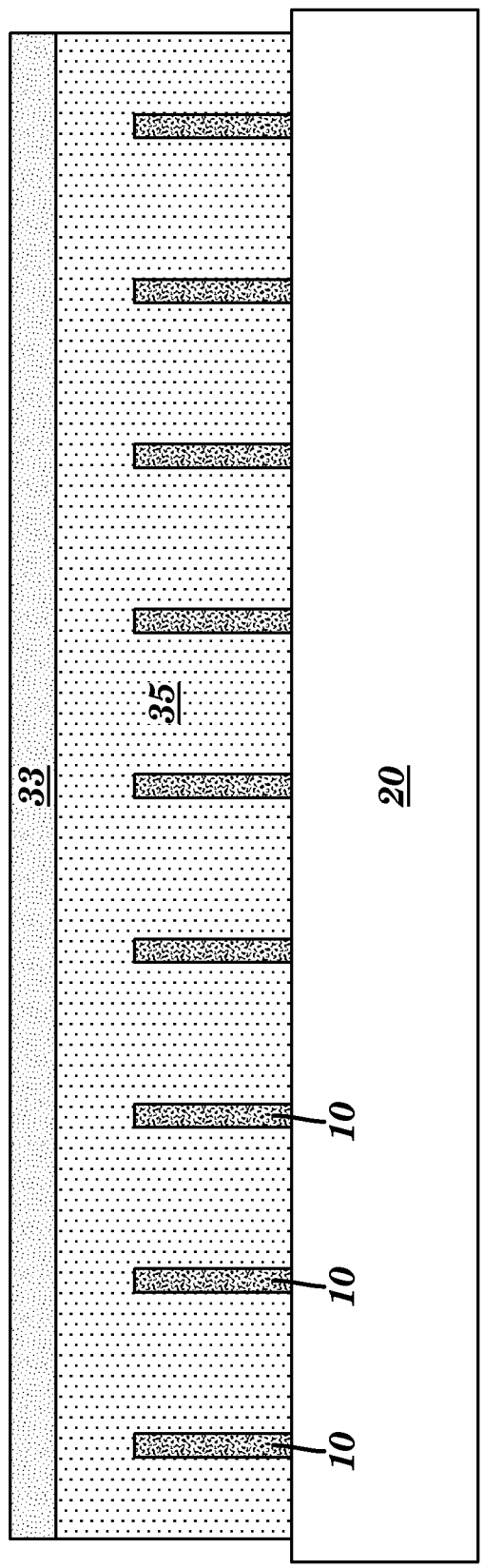

FIGS. 2A, 2B, and 2C are views of a gate array formed across an array of fins, such as the array of fins of FIGS. 1A, 1B, 1C. The one or more gates 30 of the array typically are oriented perpendicular to the fins 10, but orthogonal orientation is not required. FIG. 2B is a side view along line BB within a gate 30. Gate 30 includes a stack of materials including gate dielectric 31 disposed over the fins 10 such that the electrode 32 is insulated from the fin material. A gate cap 33 can be present on top of the electrode 32. A spacer is commonly formed over the gate stack.

The gate dielectric 31 can be an oxide, nitride, and/or oxynitride. In one example, the gate dielectric 31 can be a high k material having a dielectric constant greater than silicon dioxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, gate dielectric 31 can be a multi-layered structure comprising different gate dielectric materials, e.g., silicon dioxide, and a high k dielectric material.

The gate dielectric 31 can be formed by any deposition technique including, for example, chemical vapor deposition (CVD), plasma enhanced chemical vapor deposition (PECVD), physical vapor deposition (PVD), sputtering, or atomic layer deposition (ALD). The gate dielectric 31 often has a thickness in a range from 1 nm to 10 nm, though other thicknesses can be employed.

The electrode 32 can be any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

The electrode layer can be formed utilizing conventional deposition such as CVD, PECVD, PVD, ALD, etc., and conventional silicidation if the electrode is a silicide material. The material of electrode 32 can be formed to a depth that extends above fins 10.

Gate cap 33, if present, can be any material used as a hard mask such as silicon oxide, silicon nitride, silicon oxynitride, a dielectric metal oxide, a dielectric metal nitride, a dielectric metal oxynitride, or a combination thereof. In some embodiments, gate cap 33 can be in the range of 25 nm to 100 nm thick. The material choice may be dictated by an objective to mask certain structure, such as the gate electrode, from processing steps on other portions of the finFET.

FIG. 2C is a side view along line AA in the fin region. During formation of the gate stack 30, a spacer 35 can be formed over the gate sidewalls. Spacer 35 constitutes an insulating layer separating the source/drain regions on either side of a gate (e.g., in the fin region) from the gate electrode 32. The material of spacer 35 can be the same as the material of gate cap 33. Spacer 35 can include one or more layers which can each be formed by depositing a conformal dielectric layer such as silicon nitride, followed by an isotropic etch. Optionally, gate cap 33 can be exposed during formation of spacer 35, or (not shown) gate cap 33 might only be partially exposed during formation of spacer 35.

Figure 3A:
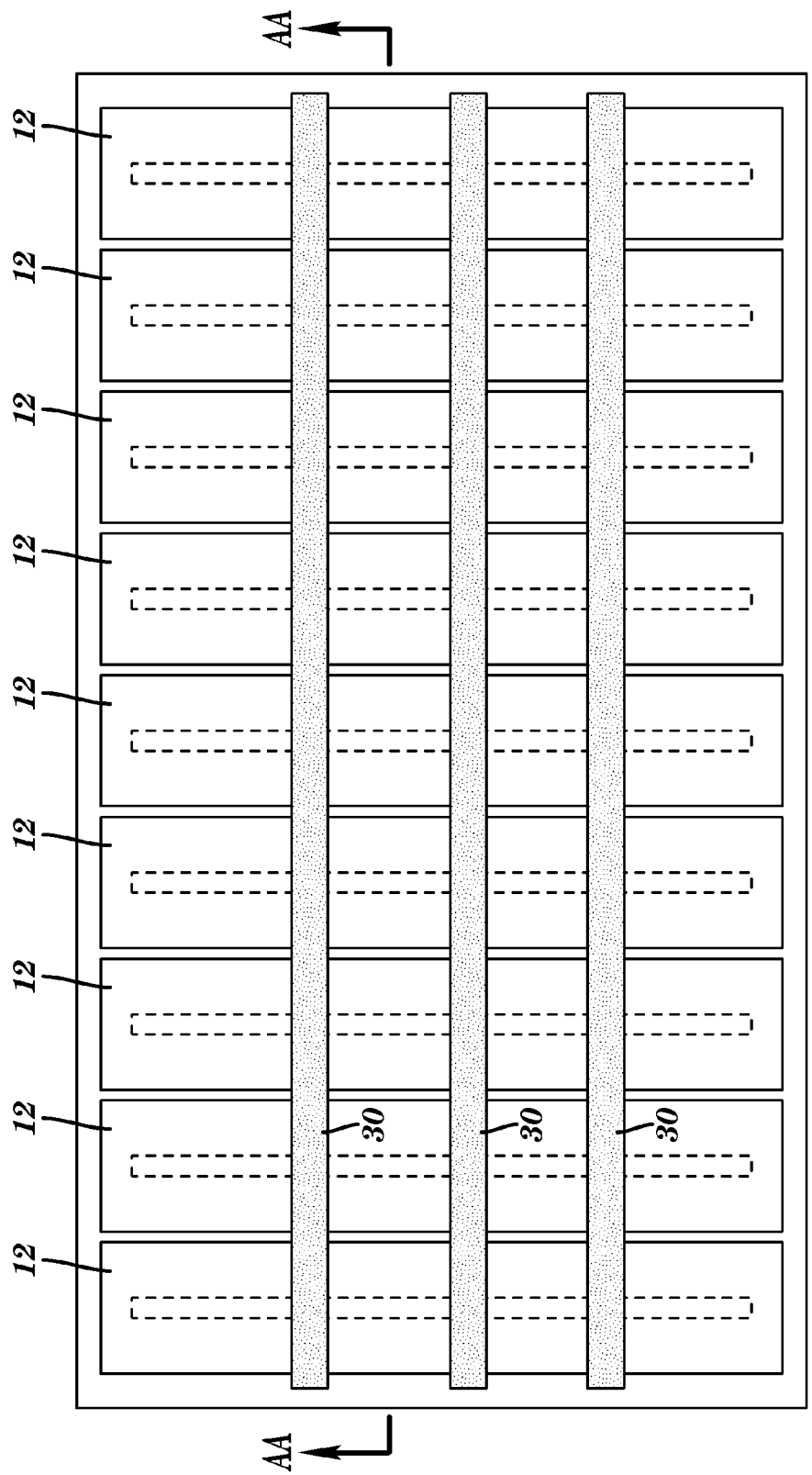
FIGS. 3A, 3B, and 3C illustrate an exemplary semiconductor structure after epitaxial growth on exposed portions of fins according to an embodiment of the present disclosure. 3A is a top-down view. 3B is a side view along line AA (between gate structures) showing unmerged epitaxial growth from the top and sides of the fins. 3C is a side-view along line AA (between gate structures) showing epitaxial growth just from the sides of the fins.
Figure 3B:
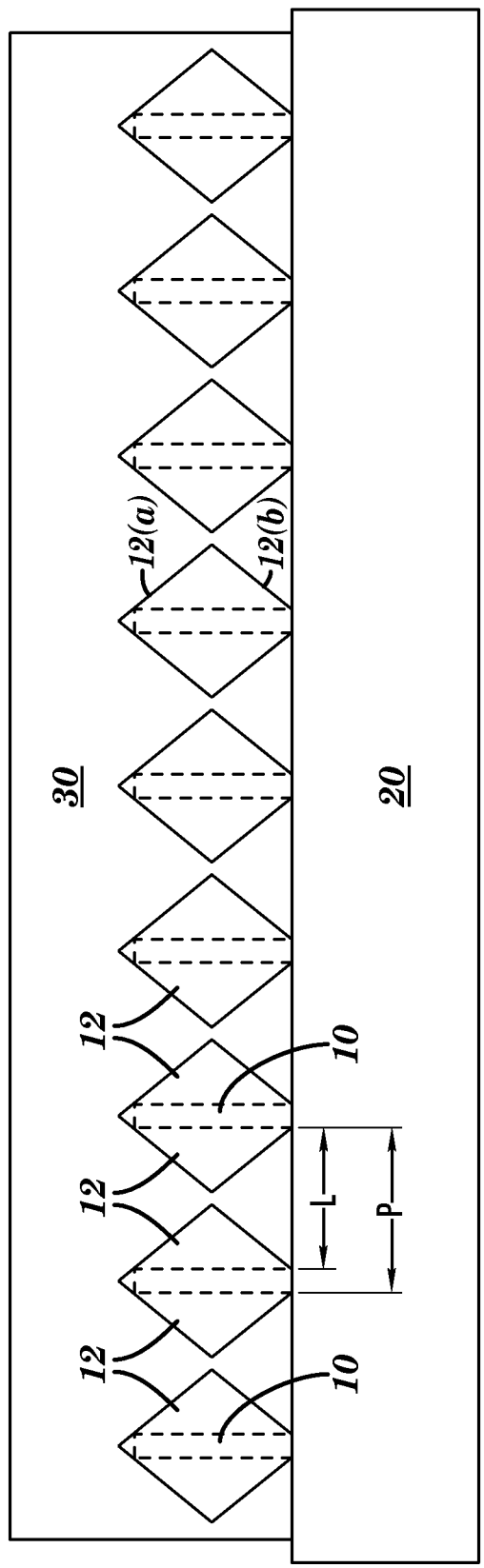
Figure 3C:
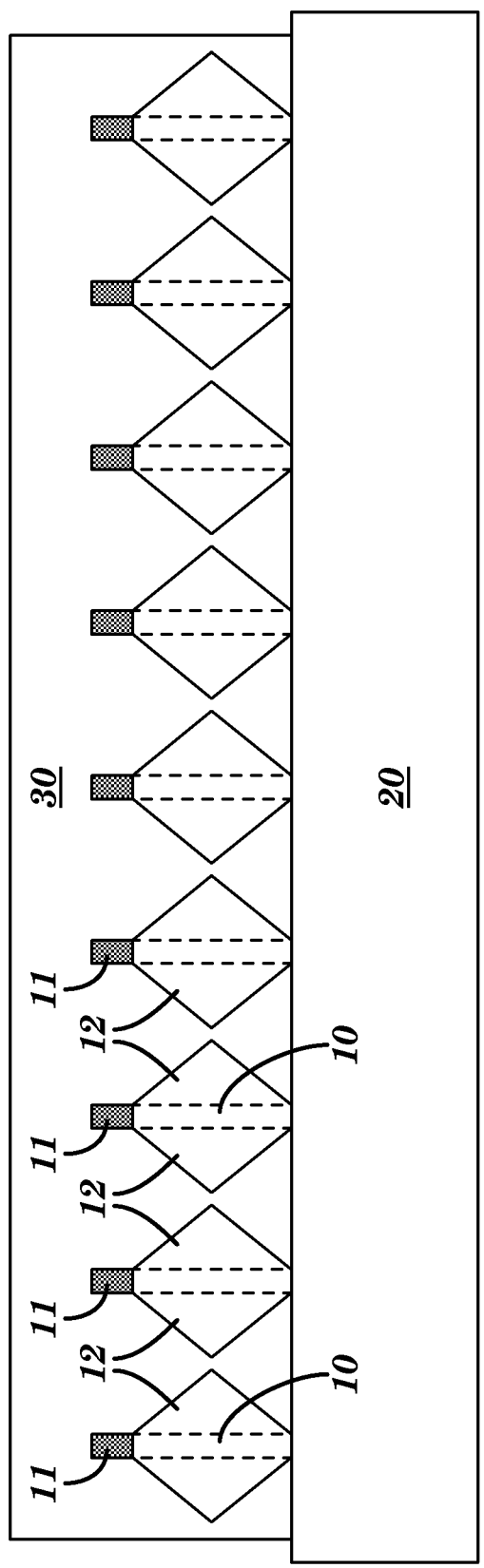

Commonly, fins having {110} sidewalls are formed from a {100} substrate. FIGS. 3A, 3B, and 3C illustrate epitaxial growth 12 from exposed surfaces of fins 10. Consistent with {110} fin sidewalls, FIG. 3B shows that epitaxial material can exhibit a diamond or faceted profile having an upper sloped surface 12a and a lower sloped surface 12b. The epitaxial material 12 can grow from a fin such that upper sloped surface 12a slopes from the top of the fin toward the substrate. As shown in FIG. 3A, epitaxial growth 12 can be stopped before growth from facing fin sidewalls merges, that is, before extending more than half the lateral distance 'L' between adjacent fins, where the pitch or center to center fin spacing 'P' minus the fin width equals 'L'. Such unmerged growth significantly increases the epitaxial material within the source/drain region (relative to the thin fins). In other embodiments epitaxial growth 16 can merge the source/drain as shown in FIG. 8A. In any event, spacer 35 is typically present on sidewalls of gate stack 30 such that the epitaxial growth in the fin region AA is separated from the gate electrode.

The term "epitaxial growth" refers to a deposition process acting on a deposition surface of a single crystalline semiconductor material whereby an "epitaxial material" forms, such epitaxial material having the same crystalline characteristics as the semiconductor material of the deposition surface. Epitaxial growth is achieved by controlling the composition and flow of source gasses and system parameters so that the depositing atoms arrive at the deposition surface of the semiconductor substrate with sufficient energy to move around on the surface and orient themselves to the crystal arrangement of the atoms of the deposition surface. Therefore, 'epitaxial material' has the same crystalline characteristics as the deposition surface on which it is formed.

Epitaxial growth does not proceed at the same rate on {100}, {110}, and {111} crystal surfaces, and therefore epitaxial material 12 can be formed with a faceted profile, such as that illustrated in FIGS. 3B and 3C. In some embodiments, the facet surface may have {111} crystal orientation grown from fin sidewalls having {110} crystal orientation. The angle α of such {111} surface is about 35.3 degrees relative to a vertical, e.g. {110} fin sidewall, and about 54.7 degrees relative to a horizontal, e.g., {100} surface. In embodiments, the fin 20 may be tapered (thinner at top and thicker at bottom), which can enable modification to the angle of the faceted epitaxial growth.

Optionally, the fins include a fin cap 11, which can be a separately deposited dielectric and/or hardmask material, or can be formed by converting a top portion of one or more fins (or the top of all the fins of the fin array) to a dielectric such as by thermal oxidation. The fin cap can preclude epitaxial growth from the top surface of the fins, such that epitaxial growth 12 extends only from the fin sidewalls as shown in FIG. 3C.

Depending on the epitaxial material to be formed, the source gases can include silicon or germanium, or both. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. The temperature for epitaxial growth can be in the range of 550° C. to 900° C. In some embodiments, epitaxial growth and/or deposition processes are selective to forming on a semiconductor surface, and does not form material on dielectric surfaces.

Epitaxial growth can utilize appropriate source gases such that epitaxial material 12 or 16 includes a dopant concentration, such as in the range of $1\times10^{19}$ atoms/cm$^3$ to $1\times10^{21}$ atoms/cm$^3$, or as sufficient to alter the charge carrier behavior of the semiconductor material. For example, epitaxial material 12 or 16 can be boron doped silicon-germanium or phosphorous doped silicon. In-situ phosphorus or boron doping can be respectively achieved using phosphine gas (PH$_3$) to silicon precursor or diborane to SiGe precursor in a ratio ranging from 0.00001% to 2%.

Optionally, after growing epitaxial material in the source/drain region, a reinforcing spacer 38 can be formed over the gate. The reinforcing spacer can be formed by depositing a conformal layer of any material appropriate for a gate spacer such as silicon nitride, followed by directional etch. The reinforcing spacer 38 will cover the sidewall of the gate, having a thin profile at the height of the gate, and a thicker profile where spacer 38 lands on the top surface of the epitaxial material in the source/drain region. Spacer 38, if present, therefore covers or seals off an edge of the epitaxial material, more specifically, the gate-adjacent edge of the upper surface of the epitaxial material.

Figure 4A:
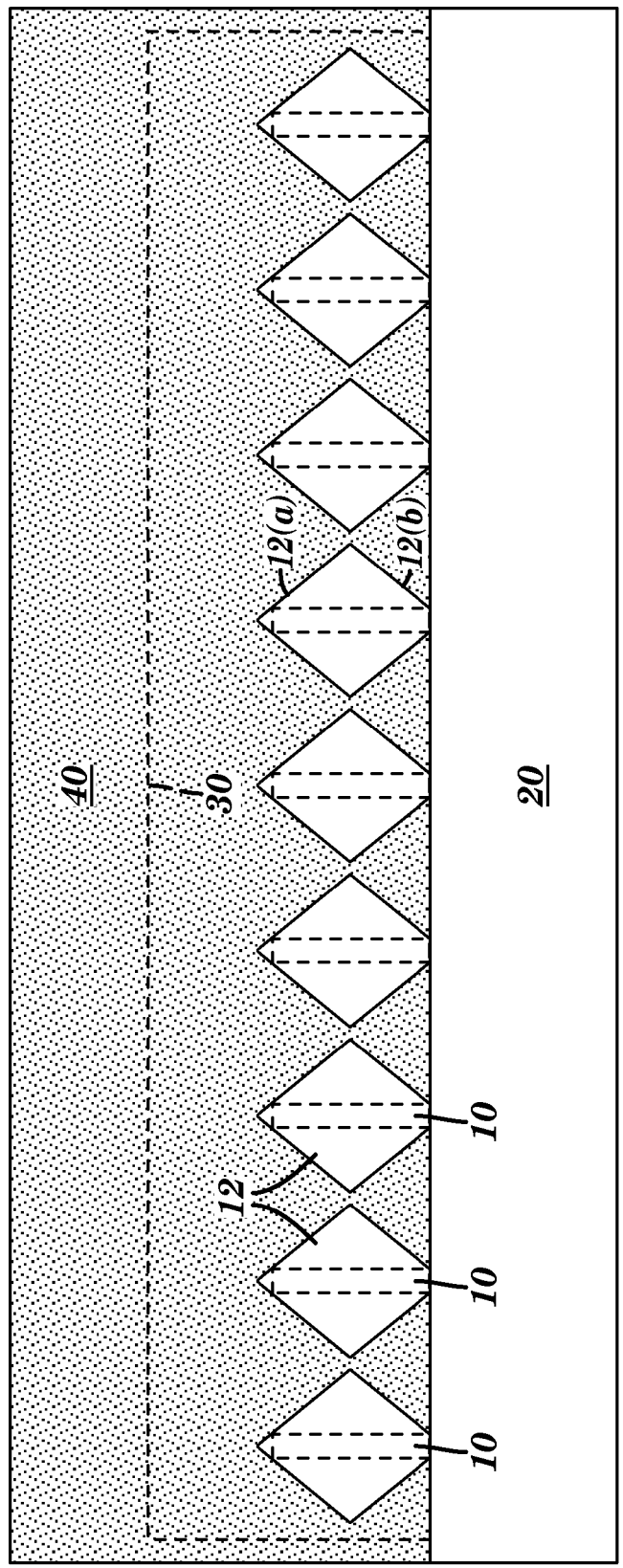
FIG. 4A illustrates the structure of FIG. 3A along line AA (between gate structures, e.g., the 'fin region') in which gaps between the epitaxial growth on the fins has been filled with a dielectric material.
Figure 4B:
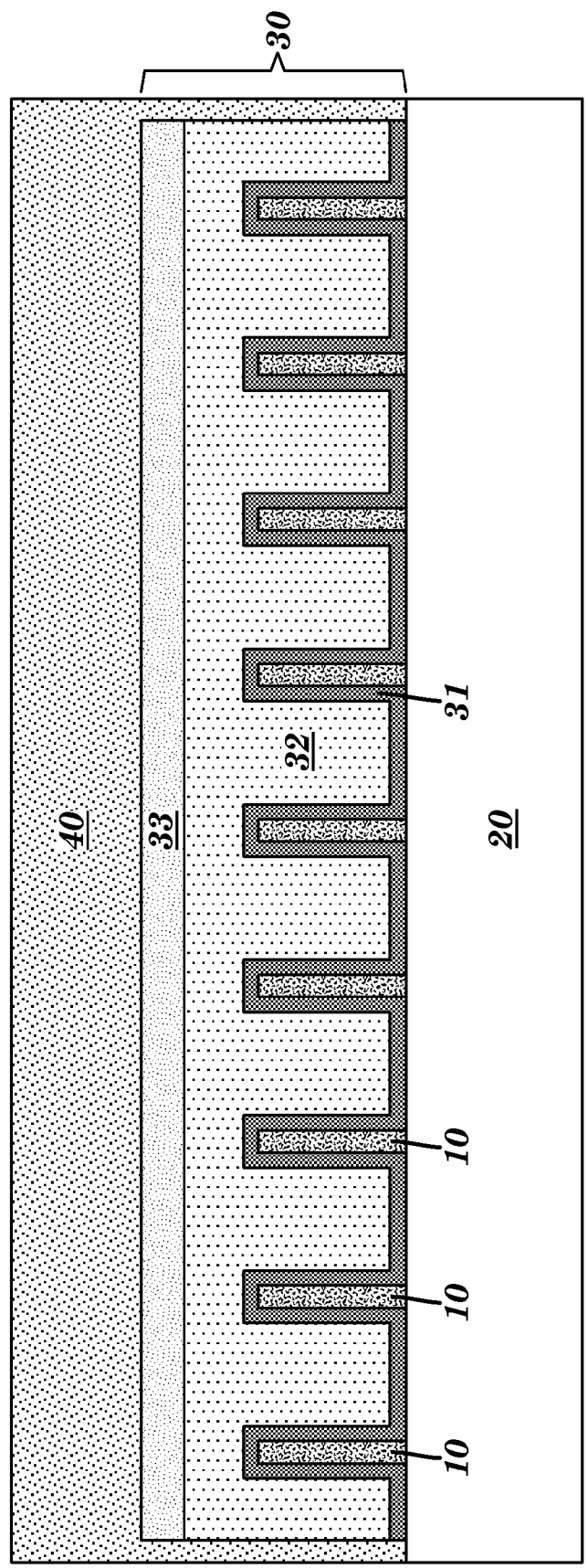
FIG. 4B illustrates the structure of FIG. 3A along line BB (within a gate structure) in which a dielectric material covers the gate structure.

Returning to the case of unmerged epitaxial growth, FIG. 4A shows a dielectric material 40 filling voids created by faceted epitaxial material 12. Dielectric fill 40 can completely fill between epitaxial material 12 and over the fins 10. FIG. 4B illustrates the structure along line BB within the gate stack and shows that dielectric fill 40 can optionally be deep enough to cover the entire gate stack 30.

Figure 5A:
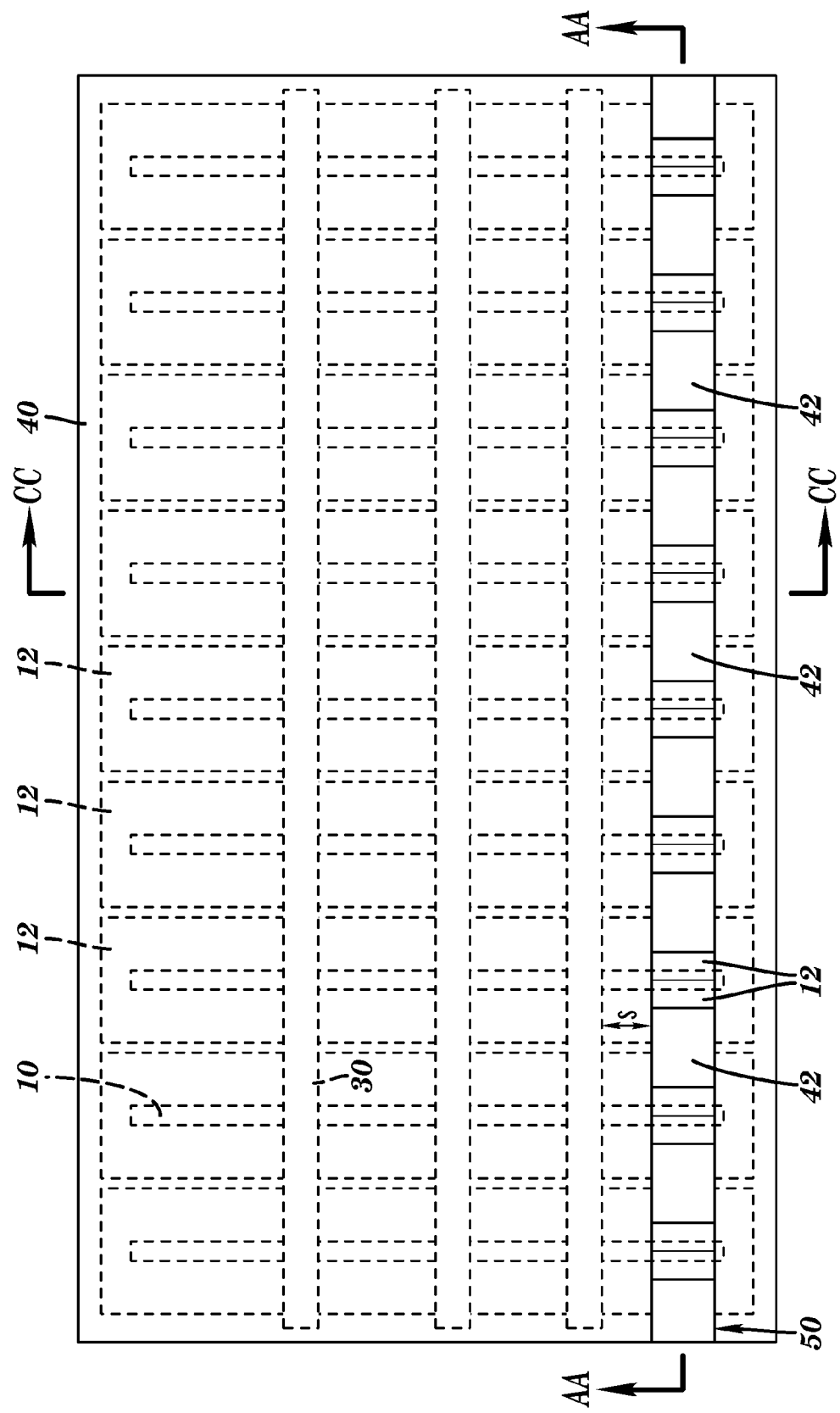
FIGS. 5A, 5B and 5C illustrate a trench exposing an upper portion of the epitaxial material in the fin region according to an embodiment of the present invention.
Figure 5B:
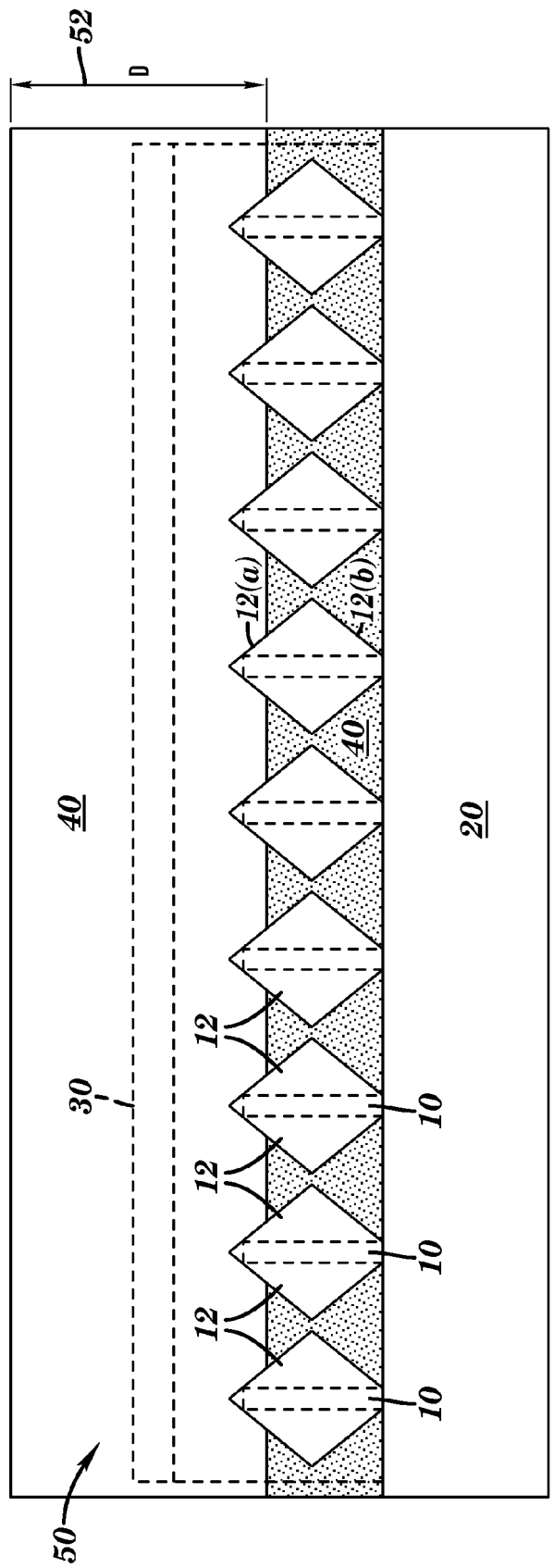
Figure 5C:
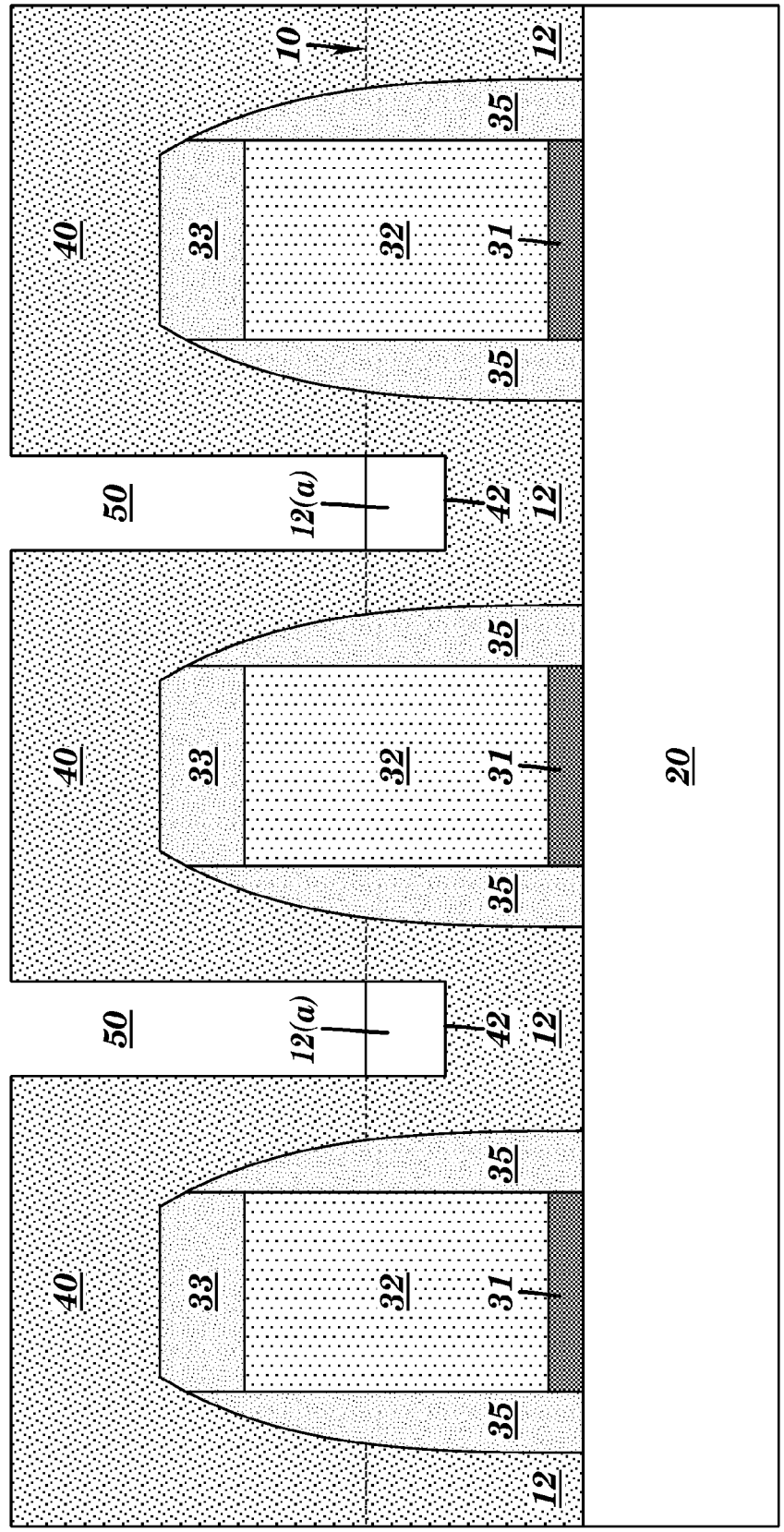
Figure 5D:
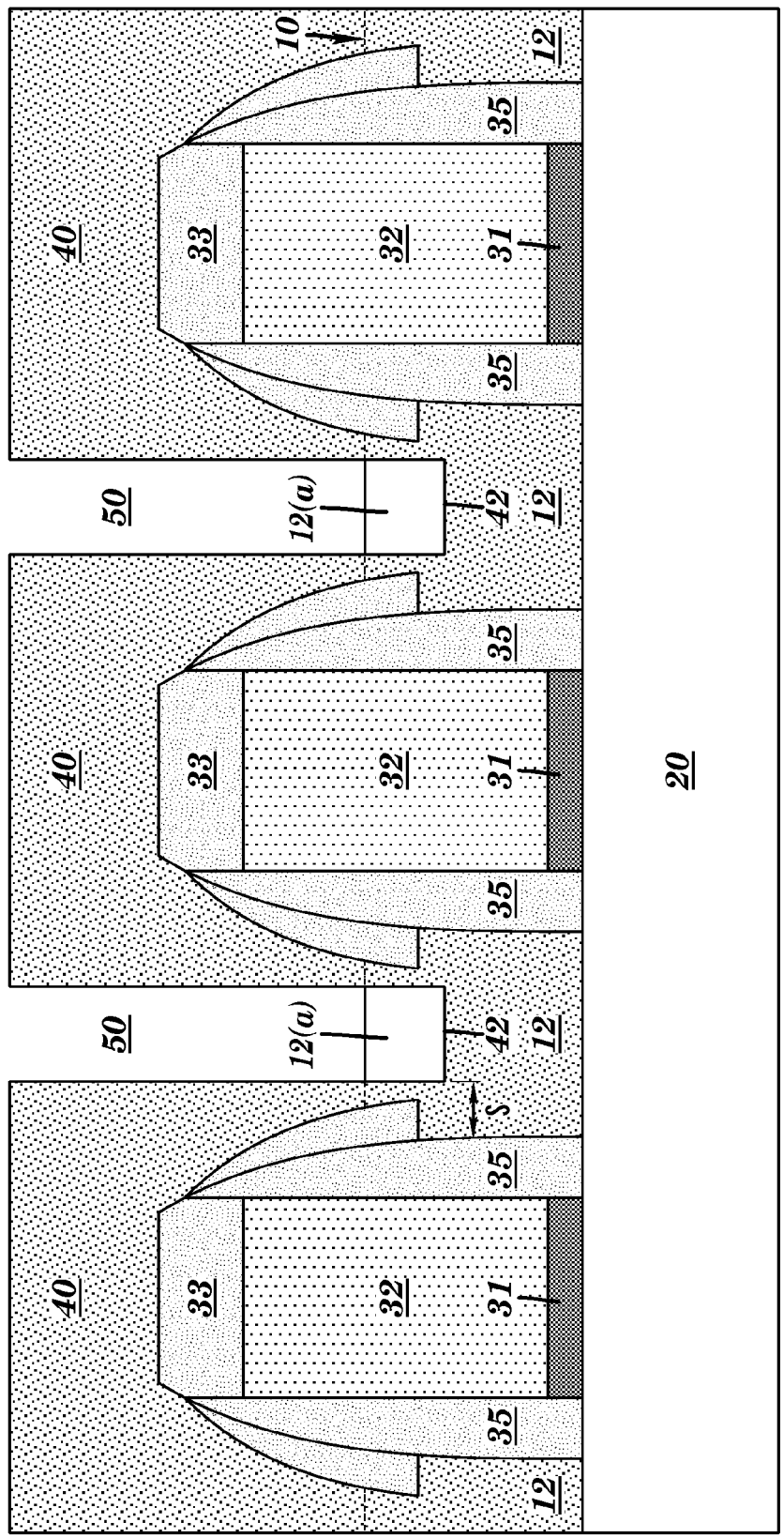
FIG. 5D illustrates a second embodiment of FIG. 5C, where a second spacer is formed between the steps of forming epitaxial material 12 and depositing dielectric material 40.

FIG. 5A shows a trench 50 that can be formed into dielectric material 40, extending generally parallel to gate 30 and spaced from gate 30 by a distance 'S'. As shown in FIGS. 5C and 5D, trench 50 can be formed between adjacent gates. FIG. 5B illustrates that trench 50 has a depth such that a portion of upper surface 12a of faceted epitaxial material segments grown on the array of fins is exposed. The bottom of trench 50 includes regions of dielectric material 42 between adjacent ones of such upper portions of epitaxial material 12. Gate stack 30 is illustrated in shadow because the trench 50 is separated from gate stack 30 not just by gate spacer 35, but also by a thickness S of dielectric material 40, more clearly shown in FIG. 5C. FIG. 5D illustrates reinforcing spacer 38 formed to a thickness less than or equal to thickness S. Then, even if alignment error causes trench 50 to be not centered between gates or patterned closer to a gate than intended, etching to form the trench will be more selective to dielectric material 40 than to the material of the reinforcing spacer, exposing only that part of the epitaxial material 12 that is at least the thickness of reinforcing spacer 38 from the gate. Spacing the trench from the gate can reduce parasitic capacitance between the gate and a subsequently formed silicide contact bar within trench 50. The spacing also constitutes a larger buffer zone to avoid poisoning the substrate, dielectric structures, or the gate electrode during the silicide process.

Figure 6A:
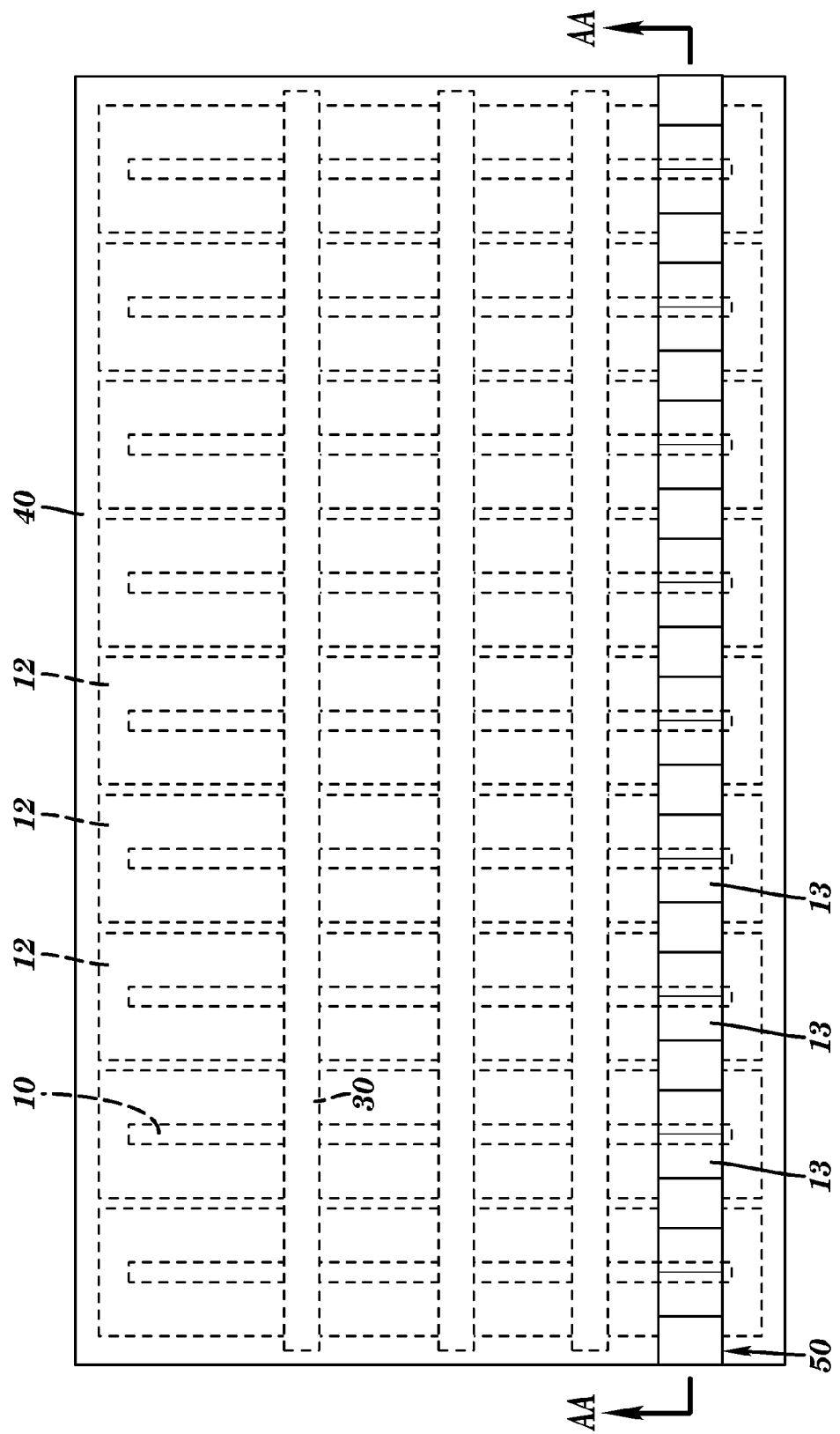
FIGS. 6A and 6B illustrate a silicon layer formed on the epitaxial material exposed within the trench.
Figure 6B:
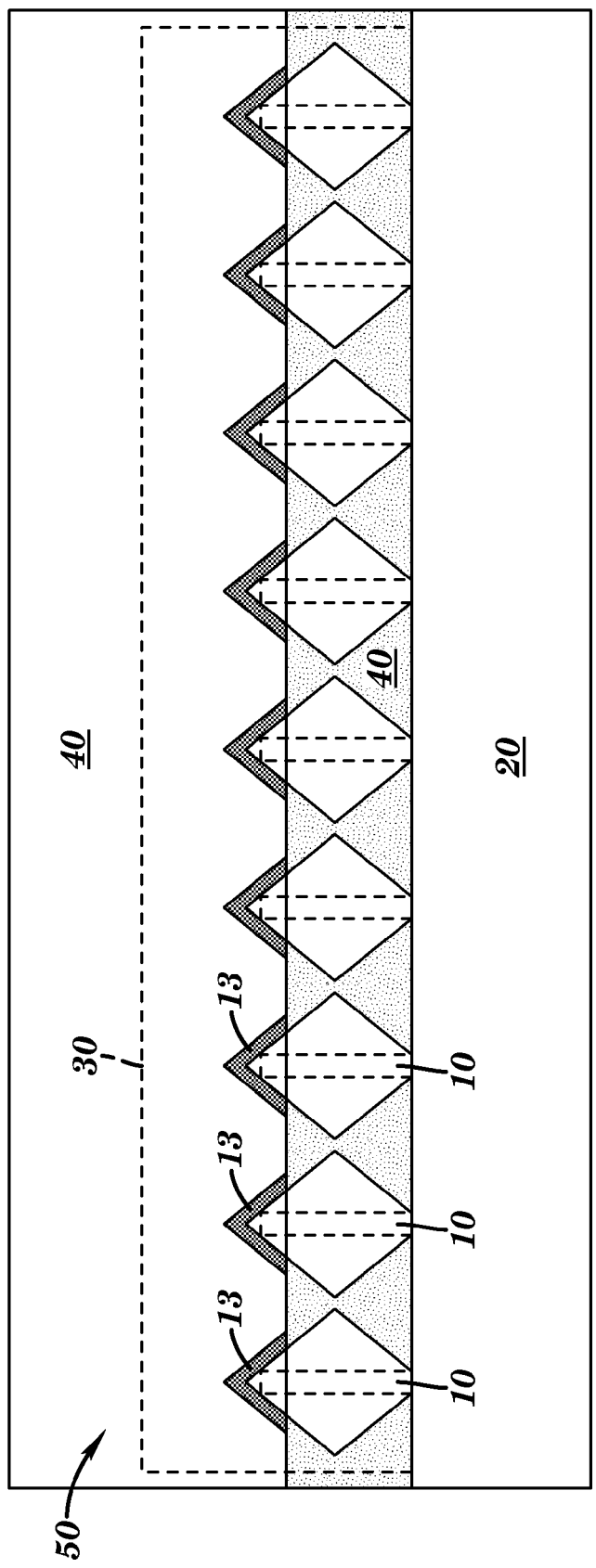

A silicon layer 13 can be formed on the exposed epitaxial material within trench 50 as shown in FIGS. 6A and 6B. Note fin cap 11, if present, can be removed before forming silicon layer 13. The silicon layer 13 can be epitaxially grown under proper conditions. Regions of silicon layer 13 can be wider than the corresponding epitaxial material regions exposed by forming trench 50, which offers a control variable depending on the design objectives. Forming trench 50 to expose more of the faceted surface of epitaxial material 12 leaves narrower intervening regions of dielectric material such that the regions of silicon layer 13 can merge; while forming trench 50 to expose less of the faceted surface of epitaxial material 12 leaves wider intervening regions of dielectric material such that the regions of silicon layer 13 are less likely or even unable to merge.

Figure 7A:
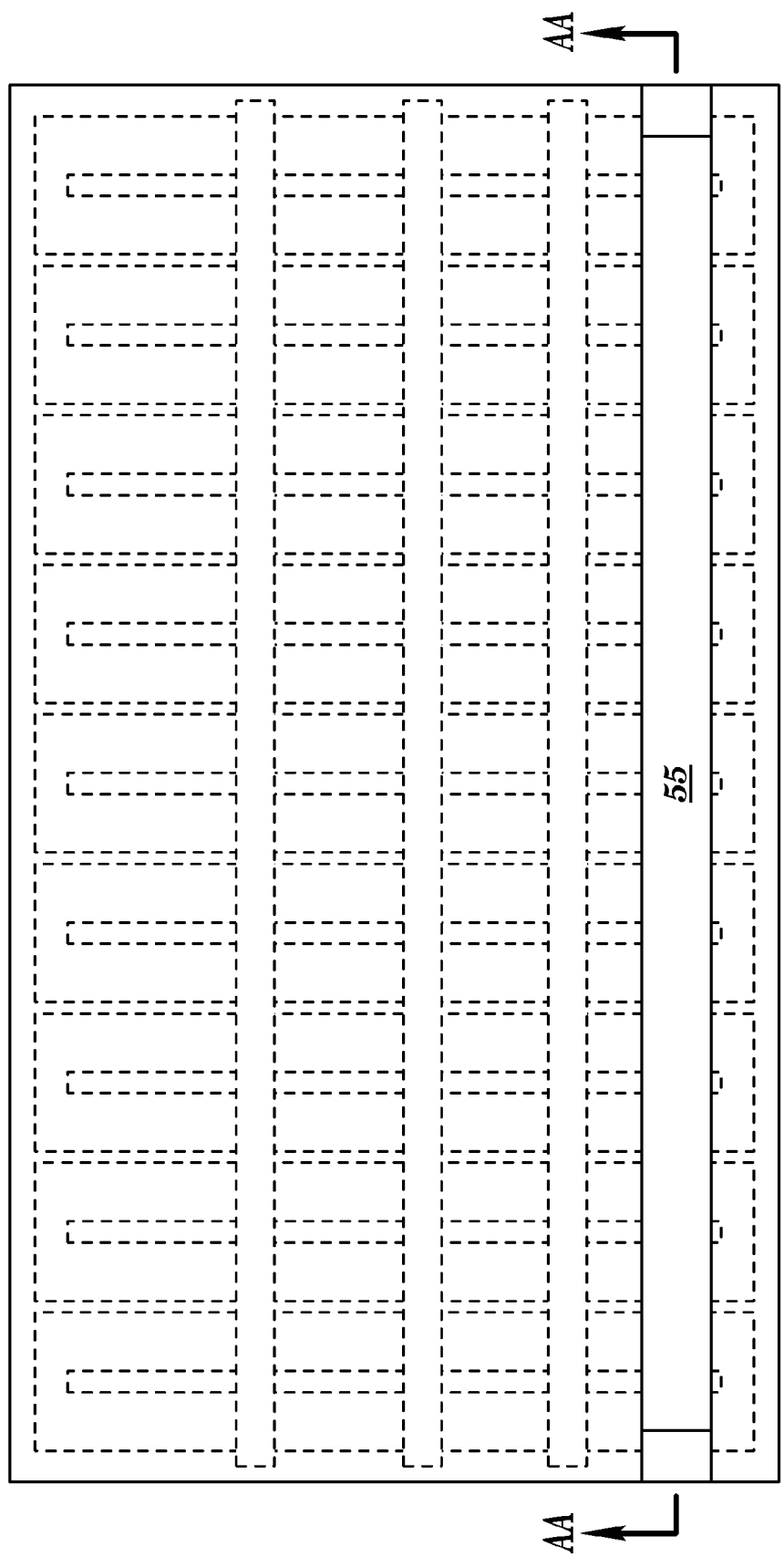
FIGS. 7A and 7B respectively illustrate a top-view and a side-view of a contact 55 in trench 50 according to an embodiment of the present disclosure.
Figure 7B:
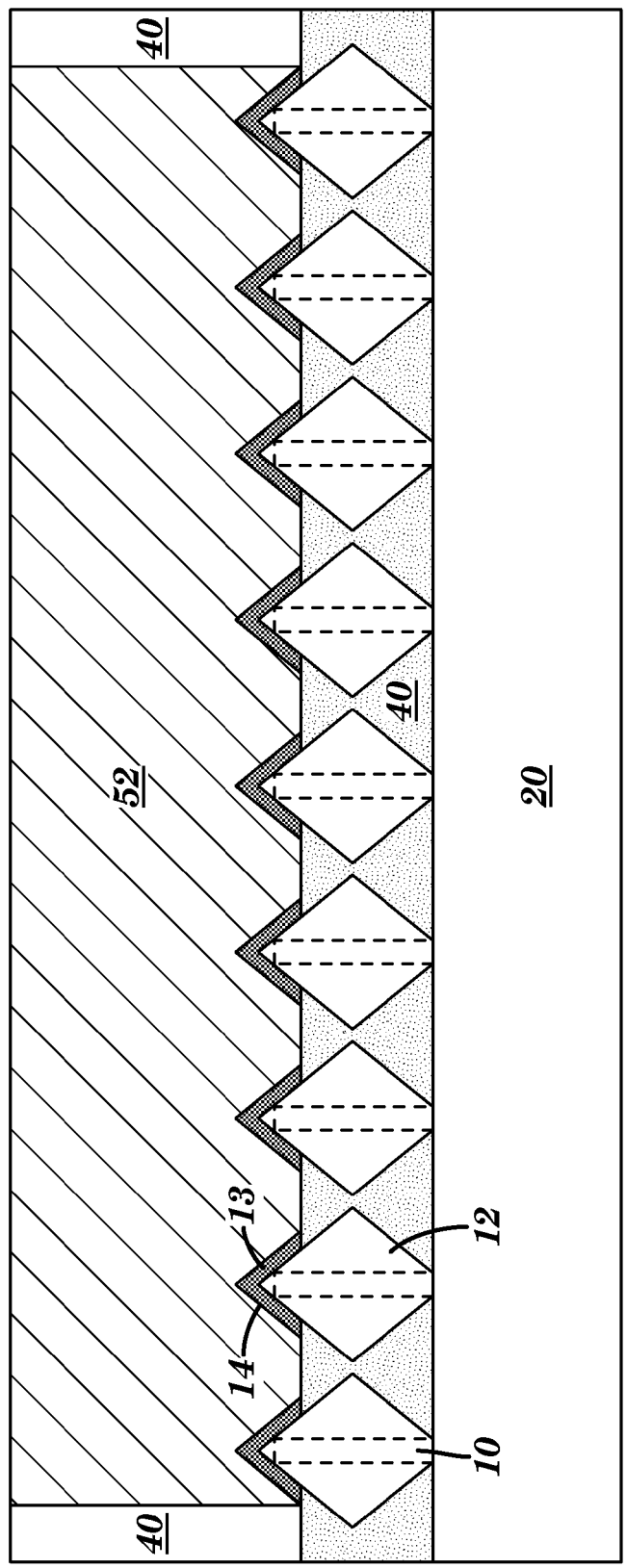

FIG. 7A shows contact bar 55 formed in trench 50. Contact bar 55 can be formed by depositing a metal silicide-forming metal 52 in trench 50 as illustrated in FIG. 7B. Metal 52, which can be for example, Ni, Pt, Co, and alloys such as NiPt, has an interface 14 with each raised silicon cap 13. An optional diffusion barrier layer (not shown) such as, for example, TiN or TaN, can be deposited atop the metal silicide-forming metal 52. Contact bar 55 can be formed by an anneal process that consumes some or all of silicon layer 13, and converts metal 52 to a metal silicide, forming contact bar 55. When Ni is used, the anneal can be conducted at temperatures in the range of 400° C. to 600° C. Any unreacted portion of the metal silicide-forming metal including the diffusion barrier layer can be removed after forming the silicide. The thickness of silicon regions 13 can be tuned such that silicon regions 13 are fully consumed. Alternatively, some portion of silicon layer 13 can remain between contact bar 55 and epitaxial material 12.

Figure 8:
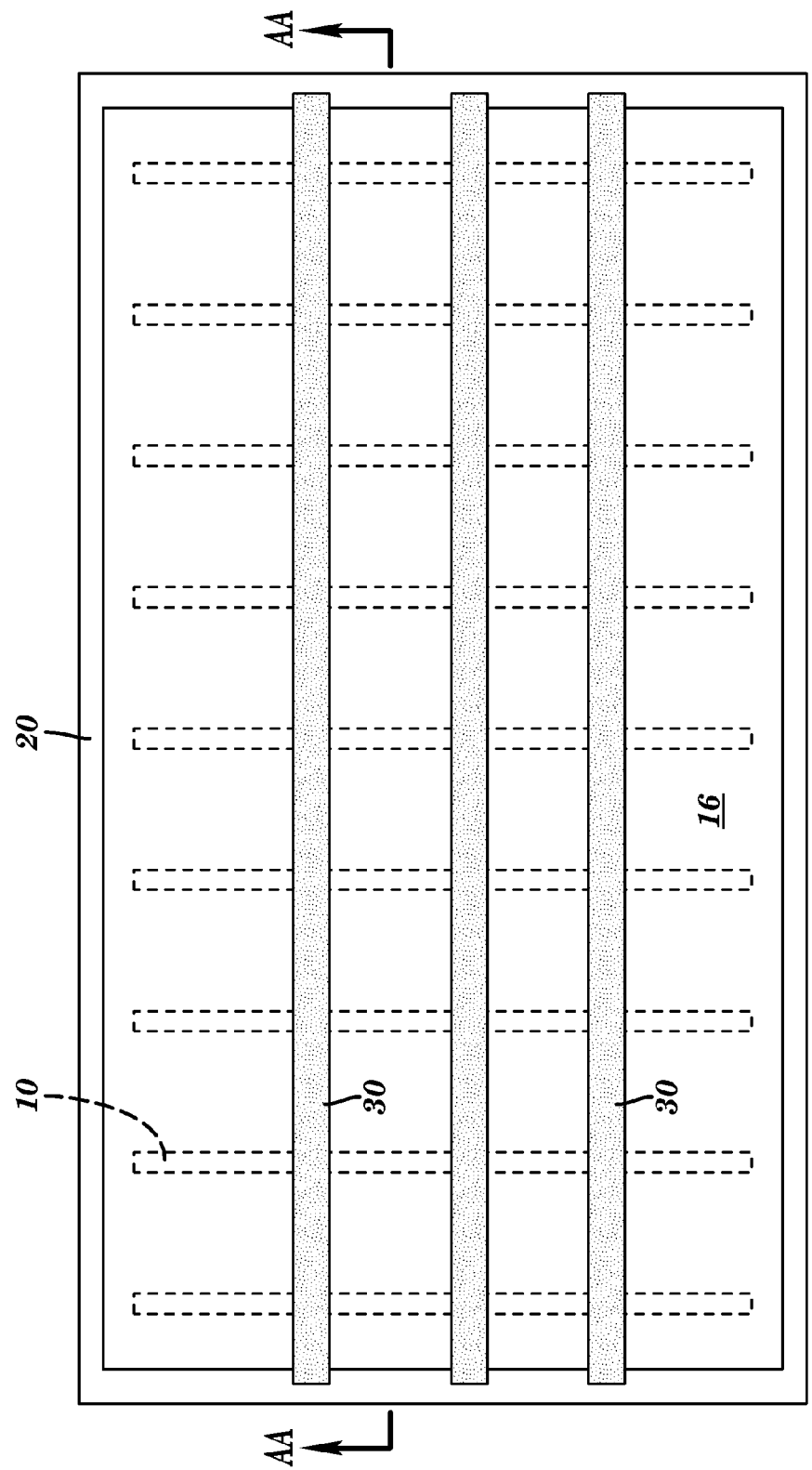
FIG. 8 illustrates a second embodiment in which epitaxial growth merges the fin region.
Figure 9:
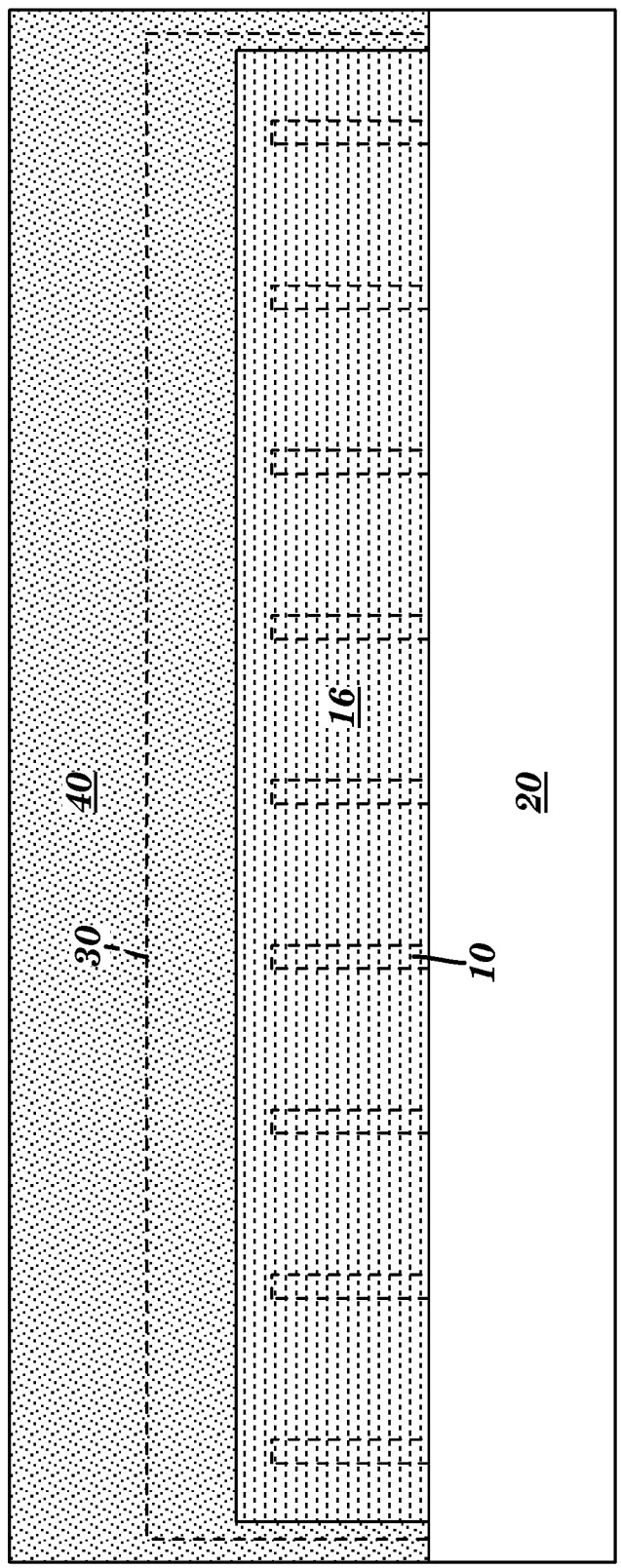
FIG. 9 illustrates a cross section of the structure of FIG. 8 along line AA (in the fin region) after filling with a dielectric material.

As noted above, according to a second embodiment, epitaxial growth 16 can merge the fins 10 in the source drain region as shown in FIG. 8. As above, an optional reinforcing spacer can be formed after forming merged epitaxial material 16. As shown in FIG. 9, a dielectric material 40 can be deposited to cover epitaxial material 16 to a depth sufficient to also cover gate stack 30. Optimally, epitaxial material 16 has a smooth and defect-free top surface.

Figure 10:
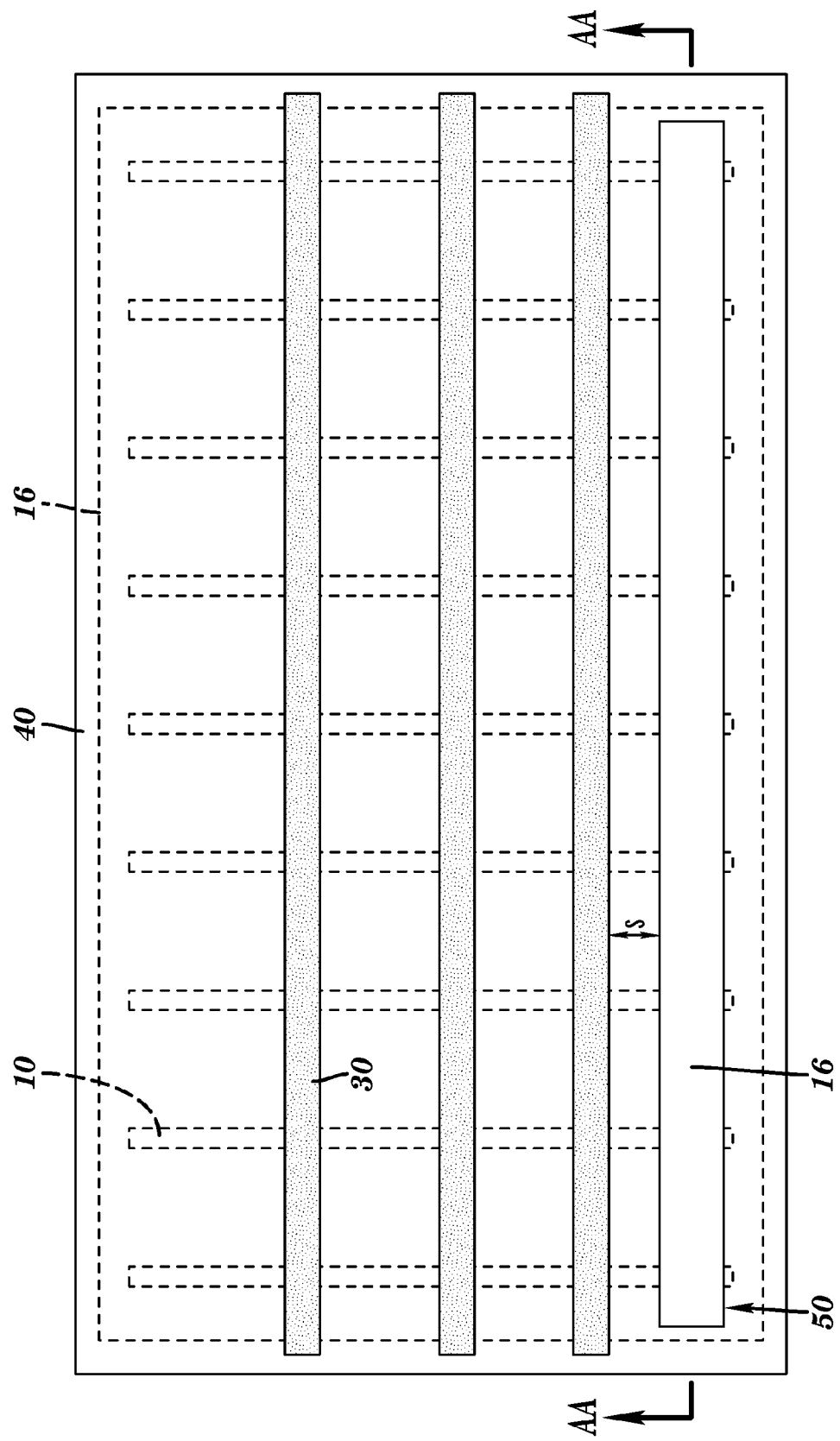
FIG. 10 illustrates a trench spaced from a gate and exposing an upper portion of the merged epitaxial material in the fin region according to an embodiment of the present invention.
Figure 11:
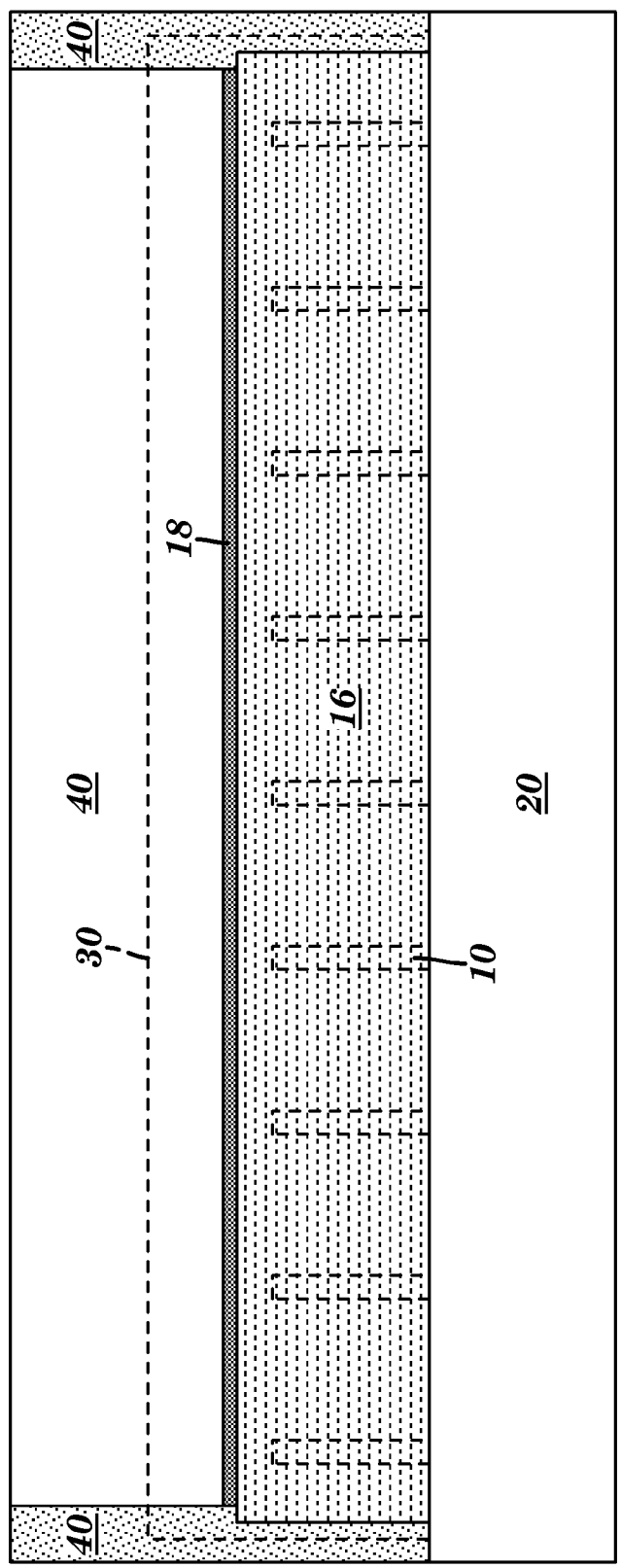
FIG. 11 illustrates a side-view of a silicon layer formed within the trench on the exposed merged epitaxial material according to an embodiment of the present disclosure.
Figure 12:
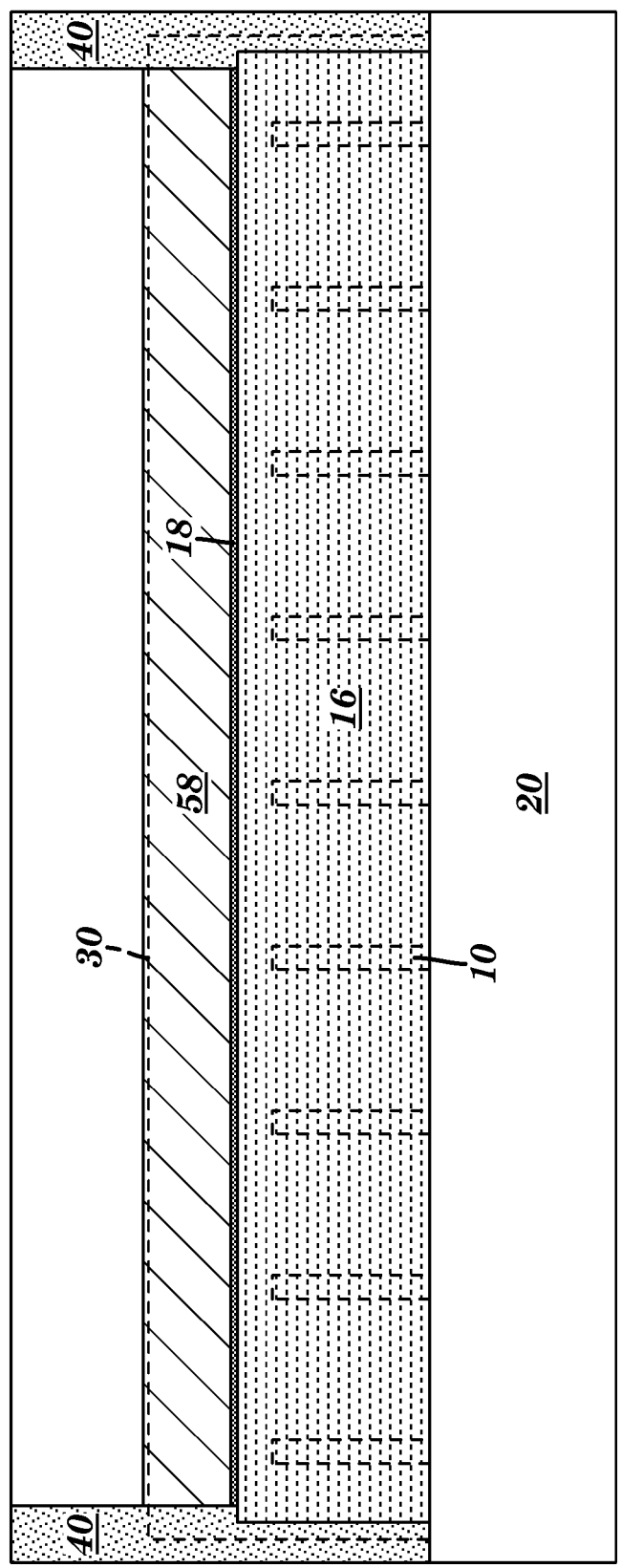
FIG. 12 shows a contact bar formed within the trench according to an embodiment of the present disclosure.

FIG. 10 shows a trench 50 formed into dielectric layer 40 exposing a portion of the top surface of epitaxial growth 16. The trench can be formed to extend generally parallel to gates 30 and spaced from gates 30 by a distance 'S'. FIG. 11 illustrates a silicon cap 18 formed in trench 50 on exposed epitaxial material 16. A silicide contact bar 58 can be formed within trench 50, using the same processes and materials as contact bar 55. Similarly, growth of silicon cap 18 can be tuned such that it is fully converted to silicide, or as shown in FIG. 12, a portion may remain under the silicide contact bar 58. It can be advantageous if merged epitaxial material 16 is grown to a depth higher than the fins, and potentially to a height close to or even greater than the height of the gate stack. In such case, the bottom of silicide contact bar 58 could be higher than the gate electrode.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method to form a finFET, the method comprising:
on an initial structure that includes (a) a gate formed over a set of fins on a substrate and (b) at least two of said set extend into a S/D region adjacent to said gate, forming epitaxial material on said at least two of said set within said S/D region;
covering said epitaxial material with a dielectric layer;
forming a cavity in said dielectric material to expose a top area of said epitaxial material, wherein said cavity extends generally parallel to said gate and is separated from said gate by a region of said dielectric material;
growing a silicon cap on said top area; and
forming a first conductive bar in said cavity.

2. The method of claim 1 wherein the gate of the initial structure is a dummy gate, the method further comprising forming a functional gate after removing the dummy gate.

3. The method of claim 1 wherein said at least two include facing sidewalls, the method further comprising:
stopping the step of forming epitaxial material before growth from each of said facing sidewalls merge.

4. The method of claim 3 wherein the top surface of said epitaxial material is sloped relative to the substrate and wherein said cavity is formed to a depth such that upper portions of said top surface are exposed and lower portions of said top surface remain covered by said dielectric material.

5. The method of claim 1 wherein said epitaxial material is formed by exposing said initial structure to conditions for in-situ doped epitaxial growth.

6. The method of claim 1 further comprising forming a reinforcing spacer before covering said epitaxial material with dielectric material.

7. The method of claim 1 wherein said epitaxial material includes a lower surface that is sloped relative to the substrate, the method further comprising filling between said lower surface and said substrate by said dielectric material.

8. The method of claim 1 wherein said cavity is a first cavity that exposes p-type doped epitaxial material, the method further comprising:
after growing a silicon cap layer on said top area within said first cavity, forming a second cavity in said dielectric material to expose n-type doped epitaxial material, wherein said second cavity extends generally parallel to said gate and is separated from said gate by a region of said dielectric material;
and forming said first conductive bar and also forming a second conductive bar by depositing a metal-silicide forming metal within said first and second cavities.

* * * * *